United States Patent [19]

Neuhaus et al.

[11] 4,380,604
[45] Apr. 19, 1983

[54] RADIATION-HARDENABLE ACRYLIC ACID ESTERS CONTAINING URETHANE GROUPS AND THEIR USE

[75] Inventors: Karl-Friedrich Neuhaus; Hermann Perrey; Karl Fuhr; Hans-Joachim Freier; Otto Bendszus, all of Krefeld, Fed. Rep. of Germany

[73] Assignee: Bayer Aktiengesellschaft, Leverkusen, Fed. Rep. of Germany

[21] Appl. No.: 325,813

[22] Filed: Nov. 30, 1981

[30] Foreign Application Priority Data

Dec. 4, 1980 [DE] Fed. Rep. of Germany ....... 3045788

[51] Int. Cl.$^3$ ...................... C08G 18/00; C08G 18/32; C08G 18/62
[52] U.S. Cl. ........................................ 524/873; 8/193; 8/DIG. 12; 204/159.19; 524/871; 528/75
[58] Field of Search ...................... 204/159.19, 159.22; 528/75; 524/871, 873

[56] References Cited

U.S. PATENT DOCUMENTS

| | | | |
|---|---|---|---|
| 3,297,745 | 1/1967 | Fekete et al. | 525/920 |
| 3,509,234 | 4/1970 | Burlant et al. | 525/131 |
| 3,759,809 | 9/1973 | Carlick et al. | 204/159.22 |
| 3,782,961 | 1/1974 | Takahashi et al. | 204/159.14 |
| 4,038,257 | 7/1977 | Suzuki et al. | 528/75 |
| 4,088,498 | 5/1978 | Faust | 204/159.14 |
| 4,131,602 | 12/1978 | Hodakowski et al. | 204/159.19 |

FOREIGN PATENT DOCUMENTS 743514 1/1956 United Kingdom .

Primary Examiner—H. S. Cockeram
Attorney, Agent, or Firm—Connolly and Hutz

[57] ABSTRACT

A radiation-hardenable binder comprising a reaction product ester containing hydroxyl groups and hydroxyalkyl acrylates, which comprises:
(A) 1 NCO gram equivalent of a polyisocyanate containing from 2 to 3 isocyanate groups per molecule;
(B) from 0.4 to 1.2 OH gram equivalents of an ethylenically-unsaturated partial ester having an OH number of from 80 to 150 of an alkoxylated trimethylol propane having a degree of alkoxylation of 3 to 4.5 and acrylic acid or methacrylic acid or a mixture thereof; and (C) from 0 to 0.6 OH gram equivalents of a hydroxy alkyl acrylate or hydroxy alkyl methacrylate or a mixture thereof containing from 2 to 6 carbon atoms in the alkyl group, wherein the sum total of the OH-gram equivalents of B and C is between 1 and 1.2.

Aqueous dispersions containing the binder are used for impregnating, coating, reinforcing or priming textile materials, wood, plastics, non-wovens or leather.

10 Claims, No Drawings

RADIATION-HARDENABLE ACRYLIC ACID ESTERS CONTAINING URETHANE GROUPS AND THEIR USE

This invention relates to radiation-hardenable acrylic acid esters containing urethane groups and to their use as radiation-hardenable coating compositions.

Acrylic resins containing urethane groups hardened by radiation are widely known. They are described as highly reactive binders having both good chemical and good mechanical properties and, for this reason, are widely used as radiation-hardenable coating compositions.

Radiation-hardenable urethane acrylates of the type obtained as reaction products of prepolymeric isocyanates and hydroxy alkyl acrylates, as described, for example, in British Pat. No. 743,514 and in U.S. Pat. Nos. 3,297,745 and 3,509,234, generally show a highly viscous and, in some cases, resin-like consistency. To convert compositions of this type into a processible form, it is essential to use large quantities of vinyl monomers, so-called reactive thinners.

In most cases, however, the use of reactive thinners means that the binder in the coating compositions is very heavily diluted so that the lacquer properties attributable to the urethane acrylates are neutralised by the reactive thinners copolymerised in the film. This effect is of course observed particularly clearly in cases where the binder has a highly viscous consistency. In addition, many vinyl monomers have a strong odour which is retained, albeit to a greatly reduced extent—in the polymer itself.

Radiation-hardenable urethane-group-containing acrylates which may be hardened with a greatly reduced content, if any, of vinyl monomers are known individually from the patent literature.

U.S. Pat. No. 3,782,961 describes photosensitive mixtures obtained as reaction products of an unsaturated carboxylic acid, a polyol and an organic polyisocyanate, the polyol essentially containing at least 5 ether bonds. Compositions of this type show favourable viscosity behaviour by virtue of their soft segments and the hardened compositions produced from them by light-induced polymerisation have been described as rubber-like elastomers for the production of rubber printing plates, nevertheless they often fail to satisfy the quality requirements which are imposed upon a hardened lacquer coating.

U.S. Pat. No. 4,088,498 describes photopolymerisable copying compositions which, in addition to other constituents, contain, as ethylenically-unsaturated compositions, reaction products of acrylic acid esters containing monohydroxyl groups, for example hydroxy ethyl acrylate, trimethylol propane diacrylate etc., of which the OH-function, and only this OH-function, may be alkoxylated, and an organic diisocyanate. These urethanised acrylic acid esters are described as highly viscous products which are applied to the substrates in question using large quantities of solvents.

Also, U.S. Pat. No. 3,759,809 describes radiation-hardenable compositions which are obtained as reaction products of a polyunsaturated ester containing free hydroxyl groups and optionally modified with an organic isocyanate and an organic isocyanate. An essential feature of the invention is that the esterification product optionally modified with an organic isocyanate also contains unreacted hydroxyl groups, as reflected in its hydroxyl number of from 15 to 70. According to the above specification the described compositions are a mixture of polyunsaturated esters, polyunsaturated esters containing free OH-functions and polyunsaturated esters containing urethane groups and, in their hardened state, they form extremely hard films. One account of the brittleness of their hardened films, compositions of this type are generally unsuitable for use as coating compositions satisfying the conventional quality requirements, in particular for flexible substrates, for example, paper, cardboard and leather, etc.

The object of the present invention is to provide new radiation-hardenable coating compositions which, on the one hand, have a low natural viscosity without the addition of diluents, such as solvents and/or reactive thinners, and which on the other hand are highly reactive, may be hardened in the presence of air and show high stability in storage under dark conditions. In addition, the hardened films or coatings are intended to combine high scratch resistance with good elasticity so that they may be used for example for coating paper, cardboard, plastics, leather, wood or non-wovens.

According to this invention, this object is achieved in that low-viscosity compositions, which, in addition to high reactivity and high stability in storage under dark conditions, provide high-quality coatings hardened in the presence of air, are obtained by the reaction of ethylenically-unsaturated partial esters containing hydroxyl groups, which formally are esters of acrylic acid or methacrylic acid or mixtures thereof and an alkoxylated, at least trifunctional, alcohol having a degree of alkoxylation of from 3 to 4.5, with polyisocyanates and optionally hydroxy alkyl acrylates and/or alkylmethacrylates.

Accordingly, the present invention provides radiation-hardenable binders of reaction products of polyisocyanates with ethylenically-unsaturated partial esters containing hydroxyl groups and, optionally, hydroxyl alkyl acrylates and/or hydroxy alkyl methacrylates, characterised in that the reaction product consists of units incorporated in the oligomeric binder comprising:

A. 1 NCO gram equivalent of a polyisocyanate containing from 2 to 3 and preferably 2 isocyanate groups per molecule, B. from 0.4 to 1.2 and preferably from 0.5 to 1.1 OH gram equivalents of an ethylenically-unsaturated partial ester, having an OH-number (mg of KOH per g of substance) of from 80 to 150, of an alkoxylated trimethylol propane having a degree of alkoxylation of from 3 to 4.5 and acrylic acid or methacrylic acid or a mixture thereof, and C. from 0 to 0.6 and preferably from 0 to 0.5 OH gram equivalents of a hydroxy alkyl acrylate or hydroxy alkyl methacrylate containing from 2 to 6 and, more particularly 2 carbon atoms in the alkyl group, and the sum of the OH-gram equivalents of B and C amounts to between 1 and 1.2 and preferably to between 1 and 1.1.

In the context of this invention, an NCO gram equivalent is understood to be that quantity of a compound in grams which contains one isocyanate group. Correspondingly, an OH gram equivalent is that quantity of a compound in grams which contains one hydroxyl group. The degree of alkoxylation is understood to be the number of moles of alkylene oxide which have reacted with one mole of the polyol. Suitable alkylene oxides are ethylene oxide, propylene oxide and butylene oxide, preferably ethylene oxide.

Polyisocyanates are understood to be difunctional and higher isocyanates, preferably difunctional and trifunctional isocyanates, particularly difunctional isocyanates. Examples of such polyisocyanates are 2,4-tolylene diisocyanate and 2,6-tolylene diisocyanate and mixtures thereof, diphenyl methane-4,4'-diisocyanate, isophorone diisocyanate, xylylene diisocyanate, hexamethylene diisocyanate, 3,3'-dimethyl diphenyl methane-4,4'-diisocyanate, 4,4'-diisocyanato-dicyclohexyl methane, 1,5-naphthalene diisocyanate, ethylene diisocyanate, propylene diisocyanate, cyclohexyl diisocyanate, cyclopentadienyl diisocyanate, 3,3'-dimethyl-4,4'-diisocyanato-dicyclohexyl methane, m-phenylene diisocyanate, triphenyl methane-4,4',-4"-triisocyanate, triphenyl urethane reaction products of 1 mole of trimethylol propane and 3 moles of tolylene diisocyanate, reaction products of 3 moles of hexamethylene diisocyanate and 1 mole of water (biuret). Tolylene diisocyanates, isophorone diisocyanate, 4,4'-diisocyanato-dicyclohexyl methane and hexamethylene diisocyanate are particularly preferred.

The polyisocyanates may be used either individually or in admixture.

According to the invention, component B comprises ethylenically-unsaturated partial esters containing OH-groups which, formally, are acrylic acid esters or methacrylic acid esters or mixtures thereof and alkoxylated trimethylol propane having a degree of alkoxylation of from 3 to 4.5.

Component B is obtained by esterifying the alkoxylated trimethylol propane with acrylic acid or methacrylic acid or a mixture thereof, by transesterifying a suitable acrylic acid ester or methacrylic acid ester or a mixture thereof with alkoxylated trimethylol propane or by reacting an acrylic acid halide or methacrylic acid halide or mixtures thereof with alkoxylated trimethylol propane, preferably in the presence of a basic auxiliary, such as a tertiary amine for example, using the methods normally employed in organic chemistry.

The reaction of the alkoxylated trimethylol propane with acrylic acid or methacrylic acid or mixtures thereof to form the ethylenically-unsaturated OH-group-containing partial esters is preferably carried out by acid-catalysed esterification in the presence of an entraining agent and the usual polymerisation inhibitors. The processes used for this purpose are known.

Particularly good results are obtained when the reaction product of 2 moles of acrylic acid and 1 mole of an ethoxylated trimethylol propane (OH-number around 550, degree of ethoxylation approximately 4) is used as component B.

Component C comprises hydroxy alkyl acrylates containing from 2 to 6, and more particularly 2, carbon atoms in the alkyl group, such as 2-hydroxethyl, 2-hydroxypropyl, 2-hydroxybutyl, 3-hydroxypropyl, 4-hydroxybutyl and 6-hydroxyhexyl acrylate and the corresponding methacrylates. 2-Hydroxyethyl acrylate, 2-hydroxypropyl acrylate and 4-hydroxybutyl acrylate are preferred; 2-hydroxylethyl acrylate being particularly preferred.

The binder according to the invention is obtained by reacting 1 NCO gram equivalent of a polyisocyanate (component A), from 0.4 to 1.2 and preferably from 0.5 to 1.1 OH gram equivalents of an ethylenically-unsaturated partial ester containing OH-groups (component B) and from 0 to 0.6 and preferably to 0.5 OH gram equivalents of a hydroxy alkyl acrylate (component C), the sum of the hydroxyl equivalents of B and C amounting to between 1 and 1.2 and preferably to between 1 and 1.1. The properties of the binder according to the invention may be influenced within wide limits by varying the ratio of component B to component C.

The reaction of the polyisocyanate with the ethylenically-unsaturated partial esters containing OH-groups and the hydroxy alkyl acrylates may be carried out by a one-pot process or in several stages at a temperature in the range from 20° C. to 90° C. and preferably at a temperature in the range from 40° C. to 70° C. Where a multistage process is used, it is preferred to react the polyisocyanate with the hydroxy alkyl acrylate in the first stage, followed in the second stage by the addition of the ethylenically-unsaturated partial ester containing hydroxyl groups.

The urethane-forming reaction may be catalysed in known manner, for example with tin octoste dibutyl tin dilaurate or a tertiary amine. Similarly, the urethane acrylate may be protected against premature and undesirable polymerisation by the addition of suitable inhibitors and anti-oxidants in quantities of from 0.001 to 0.3% by weight, based on the total mixture. These polymerisation inhibitors are also best used for obtaining high stability in storage under dark conditions.

Suitable auxiliaries of this type are, for example, phenols and phenol derivatives, preferably sterically-hindered phenol, which contain $C_1-C_6$-alkyl substituents in both o-positions to the phenolic hydroxy group, amines, preferably secondary acrylamines and their derivatives, quinones, copper(1)salts of organic acids or addition compounds of copper(1)halides with phosphites.

Suitable stabilisers of this type, include 4,4'-bis-(2,6-di-tert.-butylphenol), 1,3,5-trimethyl-2,4,6-tris-(3,5-di-tert.-butyl-4-hydroxybenzyl)-benzene, 4,4'-butylidene-bis-(6-tert.-butyl-m-cresol), 3,5-di-tert.-butyl-4-hydroxybenzyl phosphonic acid diethyl ester, N,N'-bis-(β-naphthyl)-p-phenylene diamine, N,N'-bis-(1-methylheptyl)-p-phenylene diamine, phenyl-β-napthylamine, 4,4'-bis-(α,α-dimethyl-benzyl-diphenylamine, 1,3,5-tris-(3,5-di-tert,-butyl-4-hydroxyhydrocinnamoyl)-hexahydro-s-triazine, hydroquinone, p-benzoquinone, 2,5-di-tert.-butyl quinone, toluhydroquinone, p-tert.-butyl pyrocatechol, 3-methyl pyrocatechol, 4-ethyl pyrocatechol, chloranil, napthoquinone, copper naphthanate, copper octoate, Cu(1)Cl/triphenyl phosphite, Cu(1)Cl/trimethyl phosphite, Cu(1)Cl/trischloroethyl phosphite, Cu(1)Cl/tripropyl phosphite, p-nitrosodimethyl aniline.

Other suitable stabilisers are described in "Methoden der organischem Chemie" (Houben-weyl), 4th Edition, Vol XIV/1, pages 433–452, 756, Georg Thieme Verlag, Stuttgart, 1961. Particularly suitable stabilisers are, for example, p benzoquinone and/or hydroquinone monomethyl ether used in a concentration of from 0.001 to 0.3% by weight, based on the total mixture.

The reaction products according to the invention may be used without any additionally copolymerisable monomers or solvents because the products obtained are generally low-viscosity products.

In cases where admixture with copolymerisable monomers is desired, this is of course possible. Copolymerisable monomers suitable for admixture are:

1. esters of acrylic or methacrylic acid with aliphatic $C_1-C_8$, cycloaliphatic $C_5-C_6$, araliphatic $C_7-C_8$-monoalcohols, for example methyl acrylate, ethyl acrylate, n-propyl acrylate, n-butyl acrylate, methyhexyl acrylate, 2-ethylhexyl acrylate and the corresponding methacrylic acid esters; cyclopentyl acrylate, cyclohexyl acrylate or the corresponding methacrylic acid esters; benzyl acrylate, β-phenylethyl acrylate and corresponding methacrylic acid esters;

2. hydroxyalkyl esters of acrylic or methacrylic acid containing from 2 to 4 carbon atoms in the alcohol component, such as 2-hydroxyethyl acrylate, 2-hydroxypropyl acrylate, 3-hydroxypropyl acrylate, 2-hydroxybutyl acrylate, 4-hydroxy butyl acrylate or the corresponding methacrylic acid esters;

3. di-and poly-(meth)acrylates of glycols containing from 2 to 6 carbon atoms and polyols containing from 3 to 4 hydroxyl groups and from 3 to 6 carbon atoms, such as ethylene glycol diacrylate, 1,3-propane diol diacrylate, 1,4-butane diol diacrylate, 1,6-hexane diol diacrylate, trimethylol propane triacrylate, pentaerythritol triacrylate and tetracrylate and corresponding methacrylates, also di(meth)acrylates of polyether glycols of glycol, 1,3-propane diol, 1,4-butane diol, tetraethoxylated trimethylol propane tris-acrylate;

4. aromatic vinyl and divinyl compounds, such as styrene, methyl styrene, divinyl benzene;

5. N-methylol acrylamide or N-methylol methacylamide and the corresponding N-methylol alkyl ethers containing from 1 to 4 carbon atoms in the alkyl ether group and the corresponding N-methylol allyl ethers, particularly N-methoxymethyl(meth) acrylamide, N-butoxymethyl(meth)acrylamide and N-allyloxy methyl(meth)acrylamide;

6. vinyl alkyl ethers containing from 1 to 4 carbon atoms in the alkyl group, such as vinyl methyl ether vinyl ethyl ether, vinyl propyl ether and vinyl butyl ether; and 7. trimethylol propane diallyl ether mono-(meth)acrylate, vinyl pyridine, N-vinyl carbazole, triallyl phosphate, triallyl isocyanurate and others.

It is also possible to use mixtures of one or more of the above-mentioned monomers. The addition may amount to between about 0 and 70% by weight and preferably to between 0 and 40% by weight, based on the total mixture of reaction products according to the invention and additional monomers.

It is also possible, if desired, to mix the reaction products according to the invention with inert solvents, such as butyl acetate, ethyl acetate, ethanol, isopropanol, butanol, acetone, ethylmethyl ketone, diethyl ketone, cyclopropanol, butanol, acetone, ethylmethyl ketone diethyl ketone, cyclohexane, cyclohexanone, cyclopentane, cyclopentanone, n-heptane, n-hexane, n-octane, isooctane, toluene, xylene, methylene chloride, chloroform, 1,1-dichloroethane, 1,2-dichloroethane, 1,1,2-trichloroethane and carbon tetrachloride.

The additions may amount to between about 0 and 50% by weight and preferably to between 0 and 40% by weight, based on the total mixture of reaction products according to the invention and additional solvents.

It is of course also possible to use mixtures of additional monomers and solvents within the specified quantitative ratios.

Furthermore, it is also possible to emulsify the binders according to the invention in water using external emulsifiers and, optionally, standard auxiliaries of the type used in the emulsion field and to apply them in the form of emulsions.

Suitable emulsifiers are anionic, non-ionic, cationic, ampholytic or high molecular weight substances and mixtures thereof. Corresponding emulsifiers are described for example in Ullmanns Encyclopadie der techn. Chemie, Vol. 10, 4th Edition, the chapter on emulsions, pages 449 et seq. Suitable emulsifiers may readily be determined both qualitatively and quantitatively by simple small-scale tests.

The emulsions (dispersions) may contain from 10 to 7+% by weight, preferably from 30 to 70% by weight and, more particularly, from 40 to 60% by weight of the binders according to the invention.

The reaction products according to the invention, optionally in admixture with other copolymerisable monomers, may be hardened by high-energy radiation, such as UV-light, electron beams, gamma rays, or in the presence of radical-forming substances, such as thermal polymerisation initiators.

The reaction products according to the invention are preferably used as coating compositions hardenable by UV-light. This particular application requires the addition of photoinitiators.

Suitable photoinitators are the compounds normally used, for example benzophenone and, quite generally, aromatic ketocompounds of the type derived from benzophenone, such as alkyl benzophenones, halogenmethylated benzophenones according to German Offenlgungsschrift No. 1,949,010, Michlers Ketone, anthrone and halogenated benzophenones. Other suitable photoinitiators are benzoin and its derivatives, for example of the type described in German Offenlegungsschrifts Nos. 1,769,168; 1,769,853; 1,769,854; 1,807,297; 1,807,301; 1,916,678 and 2,430,081 and in German Auslegeschrift No. 1,694,149. Other effective photoinitiators are anthraquinone and many of its derivatives, for example β-methyl anthraquinone, tert.-butyl anthraquinone and anthraquinone carboxylic acid esters, also oxime esters of the type described in German Offenlegungsschrift No. 1,795,089.

The photoinitiators mentioned above, which may be included in quantities of from 0.1 to 20% by weight and preferably in quantities of from 0.1 to 5% by weight (based on polymerisable components), depending on the purpose for which the compositions according to the invention are intended, may be used either individually or in combination with one another to achieve frequent, advantageous synergistic effects.

In many cases, it can be advantageous to use other additives either with a view to improving the film-forming properties of the resin compositions or with a view to providing the layers with a particularly scratch-resistant surface. Thus, admixture with other resins, for example with saturated or unsaturated polyesters, is readily possible.

The resins are preferably used in quantities of from 0 to 50% by weight, based on the polymerisable components. In principle, however, only resins which do not have any adverse effect upon reactivity should be used and the quantities in which they are used should be limited accordingly. Suitable lacquer-grade resins of the type commonly used in the lacquer industry are described in E. Karsten's Lackrohstofftabeller 5th Edition, Curt R. Vicentz Verlag, Hannover, 1972, pages 74–106, 195–258, 267–293, 335–347, 357–366.

Advantageous additives which can lead to a further increase in reactivity are certain tertiary amines, for example triethylamine and triethanolamine.

The additives mentioned are preferably used in quantities of from 0 to 5% by weight, based on the polymerisable components.

Suitable radiation sources for carrying out the photopolymerisation reaction are artificial light sources emitting in the range from 2500 to 5000 Å and preferably in the range from 3000 to 4000 Å. It is advantageous to use mercury vapour, xenon and tungsten lamps, particularly high-pressure mercury lamps.

In general, layers of the reaction products according to the invention ranging from 1 μm to 0.1 mm (1 μm=$10^{-3}$ mm) in thickness may be hardened into a film in less than 1 second by exposure to the light of a high-pressure mercury lamp (for example of the HTQ-7 type manufactured by Philips) arranged at a distance of approximately 8 cm.

Where fillers are employed when the resin compositions according to the invention are used as UV-light-hardening coatings, their use is limited to those which do not suppress the polymerisation reaction through their absorption behaviour. For example, it is possible to use talcum, heavy spar, chalk, gypsum, silicas, asbestos powders and light spar as light-permeable fillers.

Where hardening is carried out by means of thermal initiators or by high-energy radiation, for example in the form of electron beams or gamma-rays, it is possible in principle to use any fillers, pigments and reinforcing materials of the type normally used in lacquer chemistry.

The coating compositions may be applied to suitable substrates by means of the methods normally used in the lacquer industry, such as spray coating, roll-coating, knife-coating, printing, dip-coating, flood coating, spread coating and brush coating.

Suitable substrates are paper, cardboard, leather, wood, plastics, nonwovens, textiles, ceramic materials, mineral materials, glass, metals, artificial leather, photographic materials, for example paper provided with a photographic layer, reversal films, preferably wood, plastics, ceramic materials, mineral materials and photographic materials. Since the coating compositions harden over periods ranging from fractions of a second to a few seconds to form films having excellent mechanical properties, it is possible, for example, to adapt a coating process to the processing speeds normally used in the printing field.

The reaction products according to the invention may also be used as binders for printing inks, for the production of photo-relief printing plates and photoresist materials.

To illustrate the invention, some typical embodiments are described in the following Examples.

The viscosities quoted were determined either in a 4 mm flow-out cup according to DIN 53 211 (in seconds) or by means of a Haake type Vi 02V visc o tester (in poises, measuring range up to 4000 poises). The iodine color numbers were determined in accordance with DIN 6162.

EXAMPLE 1

(Starting Material)

An ethylenically-unsaturated partial ester containing OH groups is produced by azeotropically esterifying an ethoxylated trimethylol propane [OH number 550(mg of KOH/g of substance) degree of ethoxylation approximately 4] with acrylic acid.

925 g of ethoxylated trimethylol propane, 430 g of acrylic acid, 12 g of p-toluene sulfonic acid, 1 g of p-methoxy phenol, 1.2 g of di-tert.-butyl hydroquinone and 280 g of toluene are heated to reflux temperature while air is passed through and the water of reaction formed is azeotropically removed. After an acid number below 3 (mg of KOH/g of substance) has been reached, the solvent is removed in vacuo and the product is clarified by filtration. An ethylenically-unsaturated partial ester containing OH groups and having the following characteristics is obtained:

viscosity: 59 seconds (22° C.)
iodine colour No: 0–1
acid No: 2
OH number: 115

EXAMPLE 2

A resin according to the invention is produced by reacting the ethylenically-unsaturated partial ester containing OH groups according to Example 1, hydroxyethyl acrylate and tolylene diisocyanate.

In a stirrer-equipped apparatus, 174 g of 2,4-tolylene diisocyanate and 0.3 g of p-methoxy phenol are heated to 40°–65° C. while dry air is passed over, followed by the dropwise addition over a period of 1 hour at the same temperature of 116 g of hydroxyethyl acrylate. After an NCO value of 14.5% by weight has been reached, 490 g of the ethylenically-unsaturated partial ester containing OH-groups according to Example 1 are added over a period of 1.5 hours, followed by stirring at 50° to 65° C. until the NCO-value amounts to less than 0.1% by weight. A binder according to the invention having the following characteristics is obtained:

viscosity: 550 P (22° C.)

EXAMPLE 3

A resin according to the invention is produced in the same way as described in Example 2 except that 221 g of isophorone diisocyanate are used as the diisocyanate component. A resin according to the invention having the following characteristics is obtained:

viscosity: 510 P (22° C.)

EXAMPLE 4

A resin according to the invention is produced in the same way as described in Example 2 except that 262 g of 4,4'-diisocyanato-dicyclohexyl methane are used as the diisocyanate component. A resin according to the invention having the following characteristics is obtained:

viscosity: 850 P (22° C.)

EXAMPLE 5

A resin according to the invention is produced by reacting the ethylenically-unsaturated partial ester containing OH-groups according to Example 1 and 2,4-tolylene diisocyanate.

174 g of 2,4-tolylene diisocyanate and 0.7 g of p-methoxyphenol are introduced into a stirrer-equipped apparatus and heated to 40°–65° C. while dry air is passed over. 980 g of the ethylenically-unsaturated partial ester containing OH groups according to Example 1 are then added over a period of about 2 hours, followed by stirring at the above-mentioned temperature until the NCO-value amounts to less than 0.1% by weight. A binder according to the invention having the following characteristics is obtained:

viscosity: 400 P (22° C.)

EXAMPLE 6

A resin according to the invention is produced in the same way as described in Example 5, except that 221 g of isophorone diisocyanate are used as the diisocyanate component. A binder according to the invention having the following characteristics is obtained:

viscosity: 620 P (22° C.)

EXAMPLE 7

A resin according to the invention is produced in the same way as described in Example 5, except that 262 g of 4,4'-diisocyanato-dicyclohexyl methane are used as the diisocyanate component. A binder according to the invention having the following characteristics is obtained:

viscosity: 640 P (22° C.)

COMPARISON EXAMPLE 8

A urethane acrylate is produced for comparison purposes by reaction trimethylol propane, isophorone diisocyanate and hydroxyethyl acrylate.

663 g of isophorone diisocyanate and 0.7 g of p-methoxyphenol are introduced into a stirrer-equipped apparatus and heated to 50°–65° C. while dry air is passed over. 348 g of hydroxyethyl acrylate are then added dropwise over a period of 2 hours at the same temperature. After an NCO-value of 12.5% by weight has been reached, 134 g of trimethylol propane are added and the mixture is stirred until the NCO-value amounts to less than 0.1% by weight. A highly viscous resin is obtained.

viscosity: >>4000 P (22° C.)

COMPARISON EXAMPLE 9

For comparison purposes, a urethane acrylate is produced in the same way as described in Examle 8, except that 310 g of an ethoxylated trimethylol propane (OH number 550) are used as the polyol component. A highly viscous resin is obtained.

viscosity: >>4000 P (22° C.)

COMPARISON EXAMPLE 10

For comparison purposes, a urethane acrylate is produced in the same way as described in Example 8 except that 680 g of an ethoxylated trimethylol propane (OH number 250) are used as the polyol component. A highly viscous resin is obtained.

viscosity: >>4000 P (22° C.)

APPLICATION EXAMPLE A 50 g of a tetra-ethoxylated trimethylol propane trisacrylate (according to Comparison Example 13), 2.5 g of benzil dimethyl ketal, 10 g of benzophenone, 10 g of triethanolamine and the quantities of hexane diol bis-acrylate indicated in Table 1 are added to quantities of 75 g of the binders according to Examples 2 to 7 and Comparison Examples 8 to 10 so that a 50 second lacquer (DIN 53 211, 4 mm flowout cup) is obtained.

TABLE 1

| Resin according to: | weight (g) of hexane diol bis-acrylate | formulation |
|---|---|---|
| Example 2 | 55 | A |
| Example 3 | 60 | B |
| Example 4 | 65 | C |
| Example 5 | 55 | D |
| Example 6 | 60 | E |
| Example 7 | 65 | F |
| Comparison Example 8 | 140 | G |
| Comparison Example 9 | 133 | H |
| Comparison Example 10 | 130 | I |

The formulations A to I thus obtained are each cast onto printed cardboard to form an 8 μm thick film using a wire-wrapped metal rod. The coatings are then hardened on a variable-speed conveyor belt beneath a Hanovia lamp (80 W/cm, distance 8 cm) to form tack-free coatings which are solvent- and scratch-resistane. The results are set out in Table 2.

TABLE 2

| Resin according to: | Formulation | Reactivity (m/min) |
|---|---|---|
| Example 2 | A | 25 |
| Example 3 | B | 25 |
| Example 4 | C | 25 |
| Example 5 | D | 25 |
| Example 6 | E | 25 |
| Example 7 | F | 25 |
| Comparison Example 8 | G | 15–20 |
| Comparison Example 9 | H | 15–20 |
| Comparison Example 10 | I | 15 |

Table 1 clearly shows that binders 2 to 7 according to the invention require considerably less monomer (quantity of hexane diol bis-acrylate in gramms) for adjusting the processing viscosity. Testing of formulations A to F in Table 1 which were produced with the binder according to the invention corresponding to Examples 2 to 7 shows that these formulations have excellent reactivity in the presence of air (Table 2). The hardened coatings obtained on printed cardboard show good adhesion, are solvent- and scratch-resistant and, in bending tests (bending angle 180°), do not show any signs of cracking at the bending edge.

COMPARISON EXAMPLE 11

For comparison purposes, a resin is produced by reacting 522 g of 2,4-tolylene diisocyanate, 348 g of hydroxyethyl acrylate and 980 g of an alkoxylated trimethylol propane (OH number 174, 50% of ethylene oxide, 50% of propylene oxide) in the same way as described in Comparison Example 8. A highly viscous resin is obtained.

Viscosity: 4000 P (22° C.)

APPLICATION EXAMPLE B 1.5 g of benzil dimethyl ketal are added to quantities of 50 parts of the composition according to Examples 2 and 5 and Comparison Example 11, followed by application to a glass plate by means of a coating knife (film thickness 150 μm). The films are then hardened on a variable-speed conveyor belt beneath a Hanovia lamp (80 W/cm, distance 8 cm) to form tack-free coatings. The reactivity of and the test results obtained with the hardened films are set out in Table 3.

TABLE 3

| Resin according to | UE | Reactivity m/min. | Vickers hardness | Pendulum hardness |
|---|---|---|---|---|
| Example 2 | 390 | 30 | 13.0 | 158 sec. |
| Example 5 | 577 | 30–35 | 6.9 | 64 sec. |
| Comparison Example 11 | 306 | 15–20 | 0.5 | 21 sec. |

UE = urethane bond equivalence (gram of substance per urethane bond)
Pendulum hardness according to Konig (DIN 53 157)
Vickers Hardness according to ASTM D 1474-57T.

Table 3 shows that, for the same diisocyanate and, in the case of Example 2, the same urethane bond equivalence as in Comparison Example 11, the binders according to the invention corresponding to Examples 2 and 5 show distinctly higher reactivities in the presence of air and distinctly better film properties than the binder according to Comparison Example 11. The films of the binder according to Example 5 also show considerably better properties although in their case the urethane bond equivalence is distinctly lower than in Comparison Example 11.

COMPARISON EXAMPLE 12

For comparison purposes, a resin is produced in the same way as described in Example 2 except that 174 g of 2,4-tolylene diisocyanate are reacted with 232 g of hydroxyethyl acrylate. A highly viscous, partially wax-like resin is obtained.

COMPARISON EXAMPLE 13

For comparison purposes, an ethoxylated trimethylol propane tris-acrylate (ethoxylated trimethylol propane: OH number 550) is produced in the same way as described in Example 1 except that 648 g of acrylic acid are used. A low-viscosity liquid is obtained. Viscosity: 35 seconds (20° C.).

APPLICATION EXAMPLE C

The procedure is as described in Application Example B except that the compositions according to Comparison Examples 12 and 13 are used. The reactivity of the test results obtained with the films are shown in Table 4.

TABLE 4

| Resin according to | DBE | Reactivity m/mins. | Film properties |
|---|---|---|---|
| Example 2 | 260 | 30 | hard but elastic |
| Example 5 | 288 | 30–35 | hard but elastic |
| Comparison Example 12 | 203 | 30–35 | as hard as glass, brittle, film inelastic |
| Comparison Example 13 | 157 | (+) | |

DBE = double bond equivalent (number of double bonds per gram of substance)
(+)despite an extremely long irradiation time, no hardening could be obtained.

Evaluation of Table 4 shows that the binders containing urethane groups according to Examples 2 and 5 and Comparison Example 12 show excellent reactivity by comparison with the acrylate of Comparison Example 13 which is free from urethane groups. However, the results of table 4 also show that the compositions according to the invention corresponding to Examples 2 and 5 give coatings having excellent lacquer qualities in contrast to the compositions of Comparison Examples 12 and 13.

COMPARISON EXAMPLE 14

For comparison purposes, a binder containing urethane groups is prepared in the same way as described in Example 3 except that 340 g of a partial ester containing OH groups produced as the reaction product of 2 moles of acrylic acid and 1 mole of an ethoxylated trimethylol propane (OH number 750, degree of ethoxylation approximately 2) in the same way as in Example 1 are used. Viscosity: 980 P (22° C.).

COMPARISON EXAMPLE 15

For comparison purposes, a binder containing urethane groups is produced in the same way as described in Example 5 except that 680 g of the unsaturated partial ester described in Comparison Example 14 are used. Viscosity: 880 P (22° C.)

APPLICATION EXAMPLE D

In order to assess their stability in storage, quantities of 100 g of the binders according to the invention of Examples 3 and 5 and Comparison Examples 14 and 15 are stored in darkness at 60° C. and at room temperature with and without a photoinitiator (2.5 g of 1-(4-isopropylphenyl)-2-hydroxy-2-methylpropan-1-one). The results obtained are shown in Table 5.

TABLE 5

| Resin according to | Initiator | Stability in storage at 60° C. | room temperature |
|---|---|---|---|
| Example 3 | x | >10 days | >3 months |
| Example 5 | x | >10 days | >3 months |
| Example 3 | | >10 days | >3 months |
| Example 5 | | >10 days | >3 months |
| Comparison Example 14 | x | 5 days | 7 days |
| Comparison Example 15 | x | 2 days | 4 days |
| Comparison Example 14 | | 4 days | 15 days |
| Comparison Example 15 | | 1 day | 8 days |

COMPARISON EXAMPLE 16

For comparison purposes, a binder containing urethane groups is produced in the same way as described in Example 3 except that there are used 590 g of a partial ester containing OH-groups obtained as the reaction product of 2 moles of acrylic acid and 1 mole of an ethoxylated trimethylol propane (OH number 305, degree of ethoxylation approximately 7) in the same way as described in Example 1. Viscosity: 480 P (22° C.).

COMPARISON EXAMPLE 17

For comparison purposes, a binder containing urethane groups is produced in the same way as described in Example 5, except that 1180 g of the partial ester described in Comparison Example 16 are used. Viscosity: 380 P (22° C.).

APPLICATION EXAMPLE E 2.5 g of 2-hydroxy-2-methyl-1-phenyl propan-1-one are added to quantities of 100 g of the binders according to the invention of Examples 2 to 7 and Comparison Examples 16 to 17. 50 μm thick films of each resin formation are then knife-coated onto a mahogany board and hardened on a conveyor belt travelling at 10 m/minute beneath a Hanovia lamp (80 W/cm, distance 8 cm). The coatings thus produced are tested for their resistance to solvents by placing a moist cottonwool plug impregnated with solvent on the coatings under light pressure for 60 minutes. The results are shown in Table 6.

TABLE 6

| Resin according to | Water | Ethanol | Ethanol/Water 1:1 | Acetone |
|---|---|---|---|---|
| Example 2 | O.K. | O.K. | O.K. | O.K. |
| Example 3 | O.K. | O.K. | O.K. | O.K. |
| Example 4 | O.K. | O.K. | O.K. | O.K. |
| Example 5 | O.K. | O.K. | O.K. | O.K. |
| Example 6 | O.K. | O.K. | O.K. | O.K. |
| Example 7 | O.K. | O.K. | O.K. | O.K. |
| Comparison Example 16 | O.K. | SF. | SF. | SF. |
| Comparison Example 17 | O.K. | SF. | SW. | SW. |

O.K. = unaffected
SF = stain formation
SW = swollen

APPLICATION EXAMPLE F

An aqueous emulsion is prepared by mixing quantities of 100 g of the binders according to the invention of Examples 2 to 7 with quantities of 3 g of benzil dimethyl ketal and adding a solution of 100 g of water and 2 g of a straight-chain $C_{10}$–$C_{18}$-alkyl benzene sulfonate and 3 g of a polyvinyl alcohol (MW appriximately 80,000) in portions to the resulting mixture while stirring with a high-speed stirrer. The emulsions obtained are then knife-coated onto mahogany boards (film thickness of 150 μm). To dry off the water, the coatings were left for 8 minutes in an air stream heated to 80° C. The water-free coatings showed good film-forming properties. For hardening, the samples were placed on a variable-speed conveyor belt travelling at a speed of 15 m/minute and irradiated with a Hanovia lamp (80 W/cm, distance 8 cm). The hardened coatings obtained were solvent- and scratch-resistant and satified the quality requirements imposed on a hardened lacquer.

We claim:

1. A radiation-hardenable binder comprising a reaction product ester containing hydroxyl groups and hydroxyalkyl acrylates, which comprises:
   (A) 1 NCO gram equivalent of a polyisocyanate containing from 2 to 3 isocyanate groups per molecule;
   (B) from 0.4 to 1.2 OH gram equivalents of an ethylenically-unsaturated partial ester having an OH number of from 80 to 150 of an alkoxylated trimethylol propane having a degree of alkoxylation of 3 to 4.5 and acrylic acid or methacrylic acid or a mixture thereof; and
   (C) from 0 to 0.6 OH gram equivalents of a hydroxy alkyl acrylate or hydroxy alkyl methacrylate or a mixture thereof containing from 2 to 6 carbon atoms in the alkyl group,
wherein the sum total of the OH-gram equivalents of B and C is between 1 and 1.2.

2. A radiation-hardenable binder as claimed in claim 1, wherein the polyisocyanate is tolylenediisocyanate, isophorone diisocyanate, 4,4'-diisocyanato-dicyclohexyl methane or hexamethylene diisocyanate.

3. A radiation-hardenable binder as claimed in claim 1, wherein the alkoxylated trimethylol propane consists of trimethylol propane and ethylene oxide, propylene oxide or butylene oxide or a mixture thereof.

4. A radiation-hardenable binder as claimed in claim 1, wherein component B is obtained by reacting 1 mole of an ethoxylated trimethylol propane having an OH number of the order of 550 with 2 moles of acrylic acid.

5. A radiation-hardenable binder as claimed in claim 1, wherein the polyisocyanate contains 2 isocyanate groups per molecule.

6. A radiation-hardenable binder as claimed in claim 1, wherein the reaction product comprises from 0.5 to 1.1 OH gram equivalent of the ethylenically-unsaturated partial ester.

7. A radiation-hardenable binder as claimed in claim 1, wherein the reaction product comprises from 0 to 0.5 OH gram equivalents of the acrylate or methacrylate or mixtures thereof.

8. A radiation-hardenable binder as claimed in claim 1, wherein the hydroxy alkyl acrylate or methacrylate contains two carbon atom in the alkyl group.

9. A radiation-hardenable binder as claimed in claim 1, wherein the sum total of the OH-gram equivalents of (B) and (C) is between 1 and 1.1.

10. Aqueous dispersions for impregnating, coating, reinforcing or priming textile materials, wood, plastics, nonwovens or leather containing 10 to 70% by weight, based on dispersion, of a radiation-hardenable binder, as claimed in claim 1.

* * * * *